United States Patent
Hayashi

Patent Number: 5,926,075
Date of Patent: Jul. 20, 1999

[54] ANTENNA SWITCH

[75] Inventor: Katuhiko Hayashi, Chiba, Japan

[73] Assignee: TDK Corporation, Tokyo, Japan

[21] Appl. No.: 08/793,334

[22] PCT Filed: Jul. 19, 1996

[86] PCT No.: PCT/JP96/02014

§ 371 Date: Feb. 25, 1997

§ 102(e) Date: Feb. 25, 1997

[87] PCT Pub. No.: WO97/04533

PCT Pub. Date: Feb. 6, 1997

[30] Foreign Application Priority Data

Jul. 19, 1995 [JP] Japan .................................. 7-183119
Mar. 21, 1996 [JP] Japan .................................. 8-064020

[51] Int. Cl.⁶ .............................. H01P 1/15; H04B 1/44
[52] U.S. Cl. ...................... 333/101; 333/103; 333/132
[58] Field of Search ................................ 333/101, 103, 333/104, 126, 129, 134, 202, 167, 132; 455/78, 80, 82, 83

[56] References Cited

U.S. PATENT DOCUMENTS

| | | | |
|---|---|---|---|
| 5,473,293 | 12/1995 | Chigodo et al. .................... | 333/104 |
| 5,499,000 | 3/1996 | Morikawa et al. .................. | 333/104 |
| 5,513,382 | 4/1996 | Agahi-Kesheh et al. ........... | 333/104 X |
| 5,515,017 | 5/1996 | Yamada et al. ..................... | 333/134 X |
| 5,634,200 | 5/1997 | Kitakubo et al. ................... | 333/104 X |
| 5,642,083 | 6/1997 | Kato et al. .......................... | 333/104 X |

FOREIGN PATENT DOCUMENTS

| | | |
|---|---|---|
| 57-204747 | 12/1982 | Japan . |
| 1-67840 | 5/1989 | Japan . |
| 6-334404 | 12/1994 | Japan . |
| 6-343001 | 12/1994 | Japan . |

*Primary Examiner*—Seungsook Ham
*Attorney, Agent, or Firm*—Nikaido Marmelstein Murray & Oram LLP

[57] ABSTRACT

An antenna switch comprises a first switch device (11) for selectively coupling a common point (e) with a transmit terminal (a) or a receive terminal (c), a second switch device (12) having similar structure to the first switch device (11) for selectively coupling a common point (f) with a first antenna terminal (b) or a second antenna terminal (d), and a filter (13) coupled between the switch devices (11, 12) through capacitors (14, 15). Circuit structure of the first switch device (11) is the same as that of the second switch device (12). Components composing those switch devices are mounted on each layer of a multi-layer substrate with a symmetrical relationship. The number of components is small, and the structure of an antenna switch is simplified. It is used in a portable telephone set for switching transmit/receive operation, and switching antennas.

10 Claims, 8 Drawing Sheets

TRANSMIT/RECEIVE
SWITCH PORTION

ANTENNA SWITCH
PORTION

ANTENNA SWITCH

FIELD OF THE INVENTION

The present invention relates to an antenna switch which may be used in a radio communication system including a portable telephone system and a mobile telephone system, and other communication systems. In particular, the present invention relates to an antenna switch which is implemented by using a multi-layer substrate which may be mounted on a surface of a printed circuit board.

BACKGROUND OF THE INVENTION

In a radio communication system including a portable telephone system and a mobile telephone system, and other communication systems, an antenna switch is used. The antenna switch has an antenna switch portion which selects one of two antennas, and a transmit/receive switch portion which switches the selected antenna between transmission and reception.

The antenna switch portion switches between a small inner antenna mounted in a communication apparatus, and an external antenna.

The transmit/receive switch portion switches the selected antenna either to an output of a transmitter or to an input of a receiver. This is in high speed operation when a digital radio communication system is used.

FIG. 10 shows a prior antenna switch having a conventional antenna switch portion. In FIG. 10, the symbols C40–C43, C50–C51, C53, and C60–C62 are a capacitor, L40, L50 and L60 are a coil, DA1, DA2, DB1 and DB2 are a PIN diode, SL41 and SL42 are a strip line, Vb1 and Vb2 are a terminal for applying bias current for switching ON and/or OFF said PIN diode, Tx is a transmit terminal, Rx is a receive terminal, ANT1 is a terminal coupled with a first antenna, and ANT2 is a terminal coupled with a second antenna.

First, the basic operation of an antenna switch circuit having an antenna switch portion is described with the example of a transmit/receive switch portion. In the antenna switch in FIG. 10, when bias current is applied to a bias terminal Vb1, PIN diodes DA1 and DA2 are switched ON so that each of those PIN diodes are conducted with small resistance. Then, a strip line SL41 is grounded at the end coupled with the PIN diode DA2. When the length of the strip line SL41 is ¼ wavelength of an input signal frequency at the transmit terminal Tx, the impedance at the other end of the strip line SL41 coupled with the PIN diode DA1 is infinite, due to ¼ wavelength resonance of the strip line SL41. Thus, the portion of an input signal applied to the transmit terminal Tx passes the PIN diode DA1 to a capacitor C42. The leakage of a signal from a transmit terminal Tx to a receive terminal Rx is called an isolation.

Next, when the bias current at the bias terminal Vb1 is turned OFF, the PIN diodes DA1 and DA2 are switched OFF, and the resistance of those PIN diodes becomes infinite. Then, the transmit terminal Tx is isolated from the capacitor C42 by the PIN diode DA1. On the other hand, the signal at the capacitor C42 comes to the receive a terminal Rx through the strip line SL41, since the PIN diode DA2 is in OFF state.

The isolation is important in a transmit phase between a transmit terminal Tx and a receive terminal Rx, but it is not important in a receive phase, since transmit power is much higher than receive power. The operation of an antenna switch portion is not described since it is similar to the above described operation of the transmit/receive switch portion.

PROBLEMS TO BE SOLVED BY THE INVENTION

The above described prior art has the the following problems.

(1) In a portable telephone system, transmit frequency differs from receive frequency. The numerical value of circuit elements or circuit components in an antenna switch portion and a transmit/receive switch portion is determined so that each portion operates well. Although the structure of two portions is similar as shown in FIG. 10, numerical value of circuit elements may differ from that of the other portion. One solution for that is to define conditions for circuit elements and to get desired object characteristics by making samples repetitively. However, as there are so many combinations of conditioned circuit elements, it is much trouble in quick design of a circuit.

(2) When an antenna switch has a strip line resonator, it must be ¼ wavelength of frequency. As an antenna switch which has an antenna switch portion must include two strip line resonators, a miniaturized antenna switch which may be mounted on surface of a printed circuit board has been difficult.

(3) If we try to design an antenna switch which has a strip line resonator with a multi-layer substrate, a strip line resonator must be mounted within the substrate. When a strip line resonator is a tri-plate type which is sandwiched by a pair of ground electrodes, the spacing between ground electrodes and a strip line must be longer than a predetermined value so that desired Q of a resonator and desired line impedance are obtained. Therefore, the substrate must be thick. Further, when substrate is made of ceramics, it is hard to remove binder in sintering operation, and it is difficult to obtain a plurality of substrates by separating each chip from a mother substrate.

Accordingly, an object of the present invention is to provide an antenna switch having two portions, in which there are less kind of numerical values of circuit elements, it is small and thin in size, it has small insertion loss and large isolation, and low-pass filter characteristics provide large attenuation at harmonic frequencies of operational frequency.

SUMMARY OF THE INVENTION

An antenna switch according to the present invention comprises, a first switch means for coupling with one of two terminals and separating electrically the other terminal according to control signal, a second switch means having similar structure to that of said first switch means, a filter coupled with said first switch means through a first capacitor means, and coupled with said second switch means through a second capacitor means, each of circuit components composing said first switch means is symmetrical with corresponding circuit component composing said second switch means around said filter.

Preferably, said first switch means switches between a transmission terminal and a reception terminal, and said second switch means switches between a first antenna and a second antenna Preferably, at least a part of circuit components composing each of said switch means, said filter and each of said capacitor means are mounted on a multi-layer substrate which has a terminal for external connection of the antenna switch with an external circuit, and each components composing said first switch means are located on each layers of said multi-layer substrate with symmetrical relation with corresponding components composing said second switch means concerning center of each layer.

Preferably, said symmetrical relation is point symmetrical relation.

Said symmetrical relation is axial symmetrical relation in a modification.

Preferably, a component in said first switch means and the corresponding component in said second switch means are mounted on the same layer.

Preferably, circuit structure of said first switch means is the same as that of said second switch means, and numerical value of each component in said first switch means is the same as that in said second switch means.

Preferably, said multi-layer substrate comprises a grounded capacitor having a ground electrode on substantially the whole surface of a bottom dielectric layer facing with another electrode through said layer, a spacer portion on said grounded capacitor, and capacitor/coil portion on said spacer portion including capacitors except said grounded capacitor and/or a coil.

Preferably, each of said first switch means and said second switch means is a switch which switches a signal by turning ON and OFF current in a PIN diode.

Preferably, each of said first switch means and said second switch means has a resonator having an inductor and a capacitor for separating electrically elements which are switched off.

Preferably, said terminal for external connection is mounted on side wall of said multi-layer substrate.

Preferably, each of said first and second switch means (11, 12) comprises; a series circuit of a capacitor (C11) and a diode (D1) between a first terminal (a) and a third terminal (e), a series circuit of an inductor (L10) and a capacitor (C10) inserted between a junction point of said capacitor (C11) and said diode (D1), and ground, a control terminal (Vb) coupled with a junction point of said inductor (L10) and said capacitor (C10), a capacitor (C14) between said third terminal (e) and ground, a series circuit of an inductor (L11), a capacitor (C13) and an inductor (L12) inserted between said third terminal (e) and a second terminal (b), and a diode (D2) between a junction point of said inductor (L11) and said capacitor (C13), and ground.

(Operation)

In order to prevent direct current between first switch means and second switch means, a first capacitor and a second capacitor are inserted in series with a low-pass filter which is provided between said first switch means and said second switch means, and further, the circuit arrangement of the first switch means and the second switch means are in symmetrical relation concerning said low-pass filter. The low-pass filter functions to prevent leakage of harmonics of output signal of a transmitter to an antenna.

Numerical value of a circuit element or a circuit component in the first switch means is the same as that of a corresponding circuit element in the second switch means. Although one of the capacitors 14 and 15 is not necessary in the circuit in view of electrical operation, as one capacitor is enough for preventing direct current, the use of two capacitors is advantageous to provide symmetric relation of the circuit. When two capacitors are used, although number of components increases by one, number of kind of numerical value of circuit components decreases to half because of symmetric relation of the circuit. Therefore, when desired characteristics are determined, the combination of the numerical values of the components for satisfying said desired characteristics decreases, and therefore, the circuit design or development is carried out rapidly. Further, input impedance at two ports is the same as each other because of the symmetric relation of the circuit, although it differs for each port in a prior art, the evaluation of the characteristics may be carried out easily. Further, as no strip line is used, the size of an antenna switch is decreased.

(2) The components are mounted in point symmetrical relation concerning center X of plane of a multi-layer substrate, and therefore, numerical value of the components of the first switch means is completely the same as that of the corresponding components of the second switch means. Therefore, it is possible to design the circuit in the multi-layer substrate considering the same numerical value. Accordingly, in designing a pattern of a component in a multi-layer substrate, the symmetric relation is considered, and therefore, error and/or trouble in designing a pattern is found easily. As the pattern of a transmit/receive switch portion is the same as the pattern of an antenna switch portion, the same solution of a problem in one portion is possible to the other portion.

(3) When a multi-layer substrate is made of ceramics, a thin substrate is possible, therefore, removal of binder in sintering process is easy, and in mass production an individual chip or circuit is obtained easily by separating or dividing a chip from a mother substrate which mounts a plurality of individual circuits. The circuits are arranged symmetrically around a low-pass filter for preventing coupling between coils, desired characteristics are obtained. In particular, enough attenuation is obtained at harmonics frequency of a signal to be handled. Further, the present antenna switch provides low insertion loss, and large isolation.

(4) As the components are arranged in symmetrical relation concerning center X of a layer of a multi-layer substrate, terminals for external connection are also located symmetrically. An antenna switch is non-directional, even if it is rotated by 180°. In producing steps in mass-production of an antenna switch (mounting a PIN diode, testing characteristics, printing label, taping/packaging a product, and/or mounting on a mother printed circuit board), no trouble occurs relating to direction of a chip or a component.

(5) As for input impedance at each port, a transmit terminal has the same impedance as that of a first antenna terminal, and a receive terminal has the same impedance as that of a second antenna terminal. Therefore, the evaluation of characteristics is easy as compared with a prior art in which input impedance depends upon each port.

BRIEF DESCRIPTION OF THE DRAWINGS

FIG. 12 shows a part of perspective disassembled view of the other embodiment of an antenna switch according to the present invention.

DESCRIPTION OF THE PREFERRED EMBODIMENTS

The embodiments of the present invention are now described. FIGS. 1 through 9 show the embodiments of an antenna switch according to the present invention.

Figure 1:
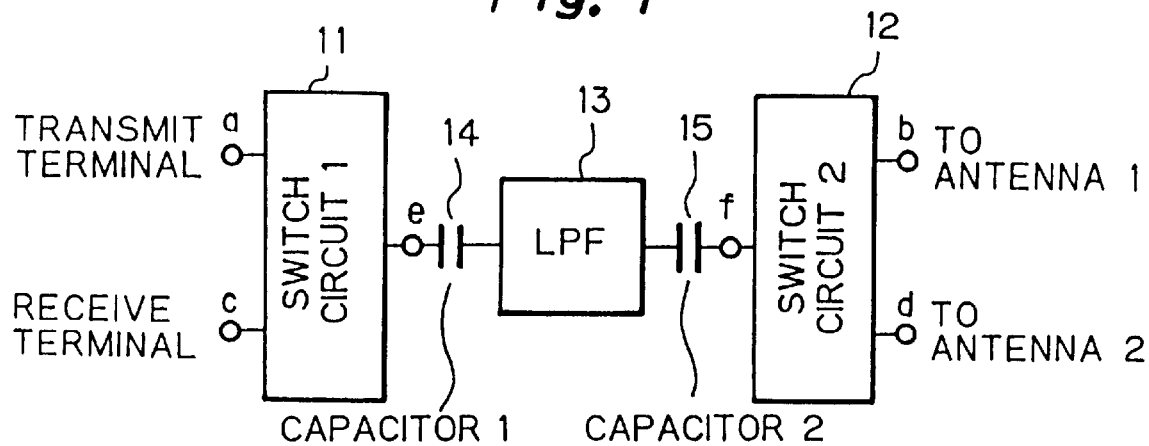
FIG. 1 shows a block diagram of an antenna switch according to the present invention.
Figure 2:
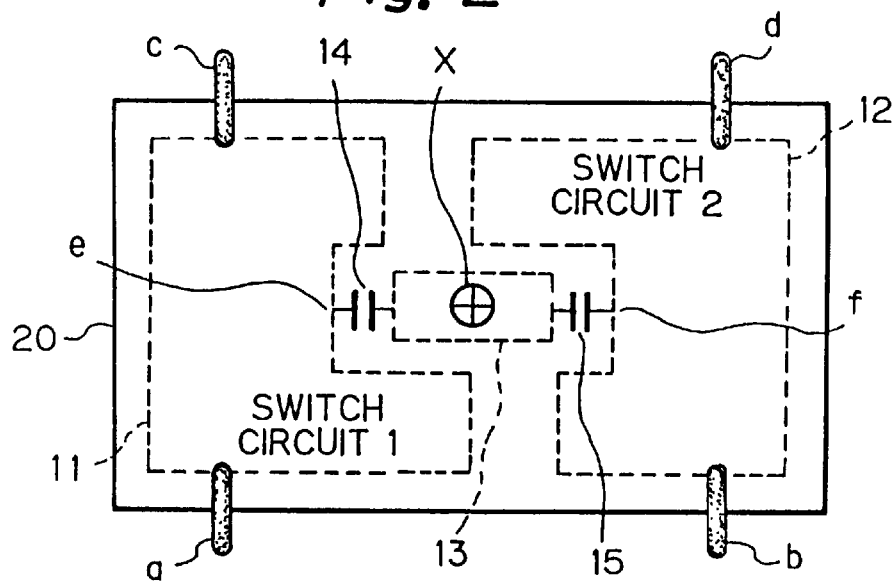
FIG. 2 shows a pattern arrangement of an antenna switch according to the present invention.
Figure 3:
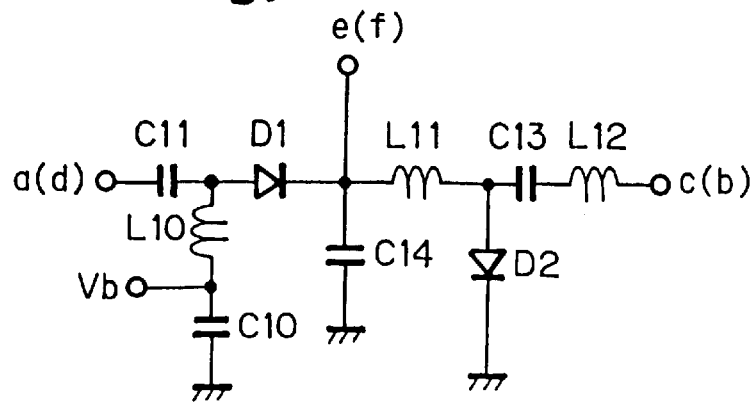
FIG. 3 shows equivalent circuit of a switch means.
Figure 4:
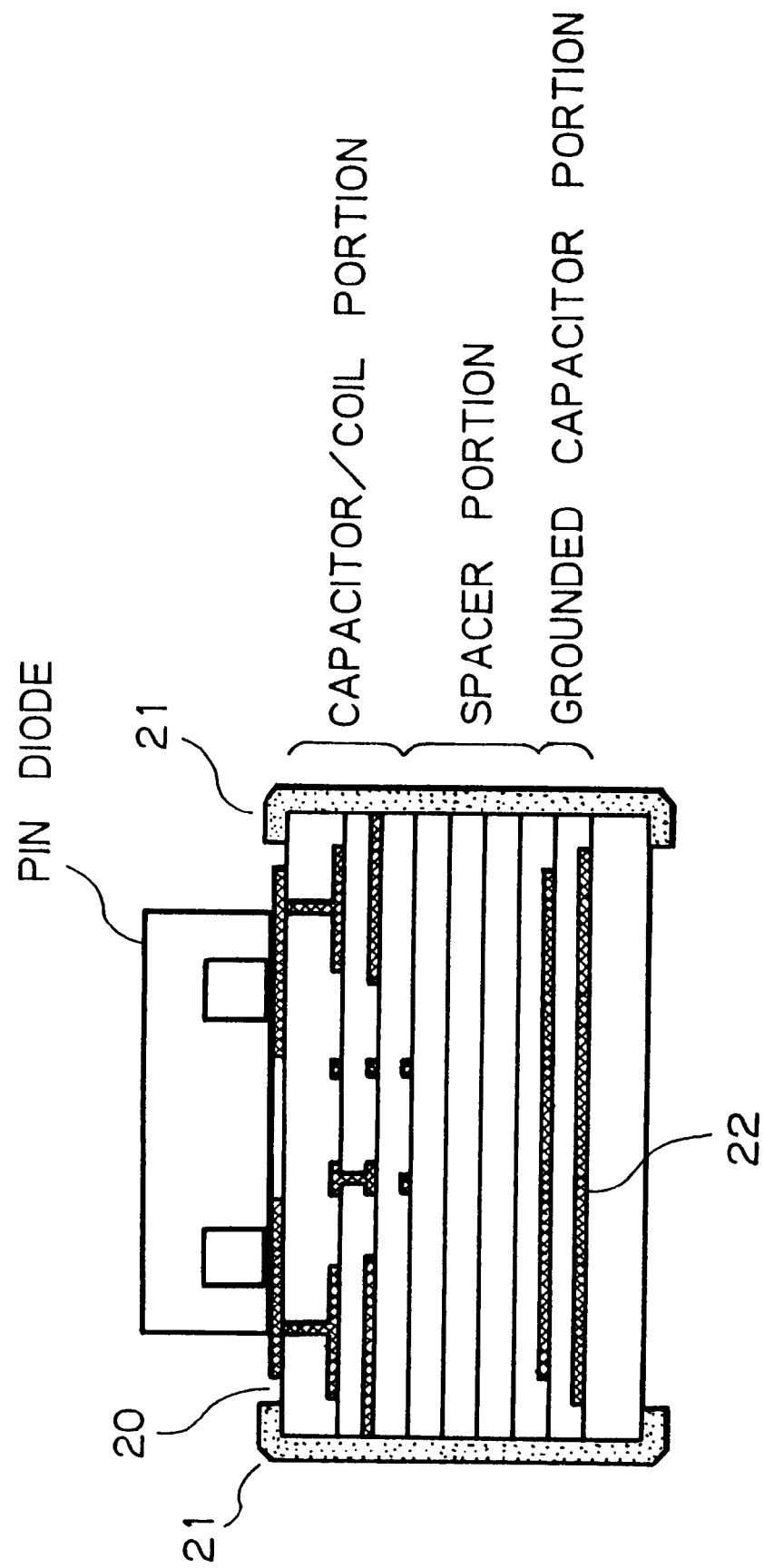
FIG. 4 shows a cross section of a multi-layer substrate of an antenna switch according to the present invention.

First, FIGS. 1 through 4 are described. FIG. 1 shows a circuit structure of an embodiment of an antenna switch, FIG. 2 shows a pattern on a multi-layer substrate of an antenna switch, FIG. 3 is an equivalent circuit of an antenna switch, and FIG. 4 shows a cross section of a multi-layer substrate of an antenna switch. In FIG. 1, the numeral 11 is a first switch circuit, 12 is a second switch circuit, 13 is a low pass filter, 14 is a first capacitor, 15 is a second capacitor, (a) is a transmit terminal of the first switch circuit 11, (c) is a receive terminal of the first switch circuit 11, (b) is a terminal of the second switch circuit 12 to be connected to a first antenna, (d) is a terminal of the second switch circuit 12 to be connected to a second antenna, (e) and (f) are points to be coupled to the capacitors of the first and the second switch circuits 11 and 12, respectively. In FIG. 2, (X) is a center portion of each layer of multi-layer substrate 20. In FIG. 3, C10–C11, C13–C14 are capacitors, L10–L12 are coils or inductors, D1 and D2 are PIN diodes, Vb is a bias terminal for turning ON/OFF a PIN diode. In FIG. 4, 20 is a multi-layer substrate, 21 is an electrode for external connection, 22 is a ground electrode pattern.

A switch circuit is explained in accordance with FIG. 3, which is generally used in a low frequency band (several hundred MHz band). When a bias terminal Vb receives bias current, PIN diodes D1 and D2 are turned ON, in other words, those diodes are conducted. Then, a signal applied to the terminal (a) is coupled with the terminal (e) through the PIN diode D1, assuming that the coil L11 and the capacitor C14 provide a parallel resonance circuit at frequency which passes the PIN diode D1 and the impedance at the junction point of the coil L11 and the capacitor C14 is infinite. It should be noted that as the PIN diode D2 is conducted, the coil L11 and the capacitor C14 are substantially coupled parallel with each other. The signal which passes the PIN diode D1 does not go to the terminal (c). A signal applied to the terminal (e) goes to the terminal (a), but does not go to the terminal (b).

Next, when the bias current at the terminal Vb stops, the PIN diodes D1 and D2 are turned OFF (non-conductive). Then, a signal applied to the terminal (c) goes to the terminal (e) through the coil L11, since the PIN diodes D1 and D2 are in OFF state. Similarly, a signal applied to the terminal (e) goes to the terminal (c), but does not go to the terminal (a). It should be noted, however, that a PIN diode is not practically ideal and does not provide infinite impedance in OFF state, and/or zero resistance in ON state, and the parallel resonance circuit of the coil L11 and the capacitor C14 does not provide infinite impedance. Therefore, proper design for numerical value of each elements must be considered so that desired insertion loss and desired isolation are obtained.

Figure 10:
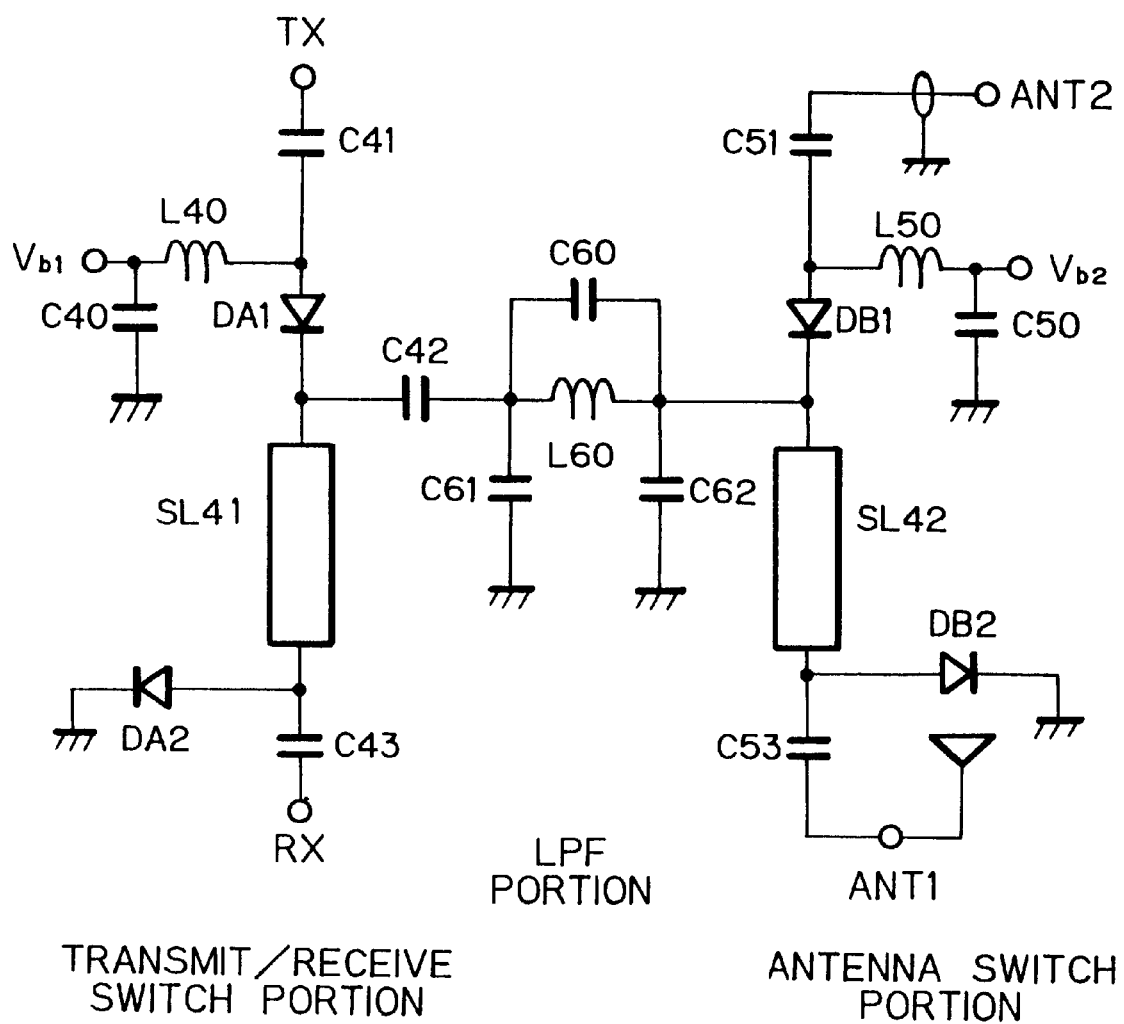
FIG. 10 is a circuit diagram of a prior antenna switch.

The switch circuit in FIG. 3 is used as a first switch circuit 11 and a second switch circuit 12 in FIG. 1 so that an antenna switch has an antenna switch portion. Two capacitors 14 and 15 are provided at both ends of the low-pass filter 13 so that current between the first switch circuit and the second switch circuit does not flow. The first switch circuit 11 and the second switch circuit 12 are symmetrically located concerning the low-pass filter 13. That symmetrical structure provides the completely same numerical value for each corresponding elements of the first switch circuit and the second switch circuit. Therefore, the kind of the number of the numerical values of the elements according to the present invention is only half of that of a prior art, although the number of elements is increased by one as compared with that of a prior art (two capacitors 14 and 15 are used in the present invention, while the prior art in FIG. 10 has only one capacitor C42). Thus, the combination of the numerical values of the circuit elements when the desired characteristics are provided is less as compared with a prior art, and quick design of a circuit in developing an antenna switch is provided. As for input impedance at each terminal, it differs for each terminal in a prior art. In the present invention, two terminals provide the same input impedance because of the symmetrical circuit arrangement, and therefore, the evaluation of the characteristics is provided easily. Further, as the present invention does not use a strip line, the present antenna switch is small in size.

FIG. 2 is an antenna switch having an antenna switch portion using a multi-layer substrate and a switch circuit (11, 12) shown in FIG. 3. Although a prior antenna switch is used for 500–600 MHz, the present invention may be used for up to 1 GHz, because of the use of a multi-layer substrate which provides each circuit elements by a pattern on a substrate so that fine design of an element is possible. Further, no strip line is used, but an antenna switch is provided by using an equivalent circuit of FIG. 3, and therefore, a capacitor and a coil are patterned on a plurality of dielectric layers which are laminated to provide a multi-layer substrate, and said multi-layer substrate is advantageous to decrease size of an antenna switch.

FIG. 4 shows a cross section of an antenna switch according to the present invention. The multi-layer substrate 20 in FIG. 4 has a bottom layer 22 which has a grounded pattern on the whole surface of one surface, and a capacitor pattern on the other surface, for a grounded capacitor. This structure allows that an antenna switch according to the present invention is not affected electrically by a mother printed circuit board which mounts the present antenna switch. A spacer portion which has no pattern is provided on said grounded capacitor layer 22, and a capacitor/coil portion which has capacitors except a grounded capacitor and coils is obtained through patterning of layers is mounted on said spacer portion. This structure allows to decrease undesirable stray capacitance of a patterned capacitor and a patterned coil to a grounded electrode. It should be noted that value of Q of a coil is decreased when an electrode pattern is located close to the coil in the thickness direction of the substrate, and insertion loss and isolation characteristics are deteriorated. Therefore, it is advantageous that a patterned layer is located with some spacing from a grounded electrode, and from a surface electrode which mounts another component.

As described above, an antenna switch according to the present invention has more space in the substrate as compared with a prior art which mounts a strip line in a substrate, and further, the thickness of the spacer portion is only the length between a strip line and a ground electrode of a prior strip line resonator using a tri-plate line, depending upon desired characteristics of the antenna switch. As a result, the thickness of the antenna switch of the present invention is only half of that of a prior antenna switch which uses a tri-plate type strip line resonator.

It should be noted that the coil L11 has relatively large (impedance of the coil is higher than 50 ohms at the frequency used). Therefore, the coil L11 is large in size, and a pattern of the coil L11 occupies large area in the multi-layer substrate. Therefore, if each switches are located with axial symmetric relations concerning the center of a layer of the multi-layer substrate 20, a coil L11 of a switch might be adjacent with another coil L11 of another switch. If two coils L11 which have large impedance are located close with each other, the coils might be magnetically coupled with each other, and the characteristics of the antenna switch might be far from the desired ones.

In particular, if a coil L11 in a transmit/receive switch portion is magnetically coupled with a coil L11 in an antenna switch portion, the coupling is high in high frequency, and the coupling is effected bypassing the low-pass filter, and in that case, the attenuation characteristics at harmonic frequency band might be deteriorated. In order to get rid of that, the spacing between the coils L11 in each switch portions must be as large as possible, and preferably, switch circuits are located with point symmetric relations (rotational symmetric relations by 180°) concerning a center portion X of the multi-layer substrate 20 as shown in FIG. 2. That structure assures to prevent the close location of a coil L11 in each switches.

As described above, an antenna switch in which it is small in size by using a multi-layer substrate, thickness of a substrate is almost half of that of a prior art, number of kind of circuit elements is few, insertion loss is small, isolation is large, and large attenuation at harmonic frequencies of the frequency to be used by a low-pass filter, is provided.

The embodiment of the present antenna switch is described in more detail in accordance with FIGS. 5–9, in which the same members as those in FIGS. 1–4 are shown with the same numerals.

Figure 5:
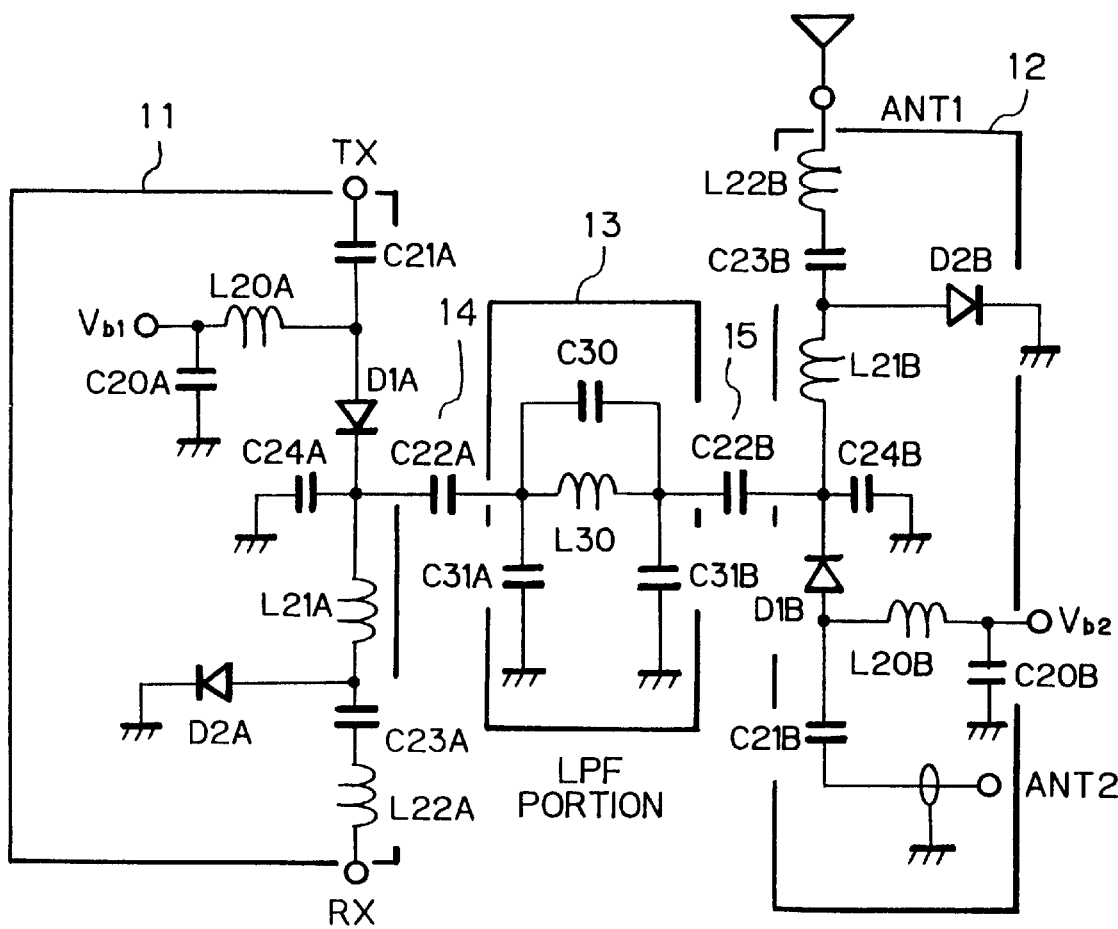
FIG. 5 is a circuit diagram of an antenna switch according to the present invention.

FIG. 5 shows a circuit diagram of an antenna switch of the present embodiment. In FIG. 5, the symbols C20A–C24A, C20B–C24B, C30, C31A and C31B are a capacitor, L20A–L22A, L20B–L22B and L30 are a coil or an inductor, D1A, D2A, D1B and D2B are a PIN diode. In the symbols of capacitors and coils, the numerical value of inductance or capacitance of the same symbols except the last figure A or B has the same inductance or the same capacitance. In other words, the capacitance of the capacitor C20A is the same as the capacitance of the capacitor C20B, and capacitors C21A and C21B are the same, the capacitors C22A and C22B are the same, the capacitors C23A and C23B are the same, the coils L22A and L22B are the same, and the coils L20A and L20B are the same. Further, the PIN diodes D1A and D1B are the same, and D2A and D2B are the same.

The current embodiment is an antenna switch used in approximate 1 GHz, and the numerical values of each elements in FIG. 5 are designed for that frequency on the condition that the structure of a switch circuit in an antenna switch portion is the same as that of a transmit/receive portion, and the numerical values of each elements are the same as those of the corresponding elements in each switch portions. As for a PIN diode, the frequency characteristics of it are measured as S parameter, and the measured result is inserted in a transmission equation in the equivalent circuit of FIG. 5. With the above conditions, the optimized numerical values of the capacitors and the coils (inductance) are designed so that the insertion loss (between Tx and ANT1, Tx and ANT2, Rx and ANT1, Rx and ANT2) at frequency used is the minimum, and the isolation between the transmission terminal Tx and the reception terminal Rx when the PIN diode in ON state is higher than 20 dB.

Figure 6:
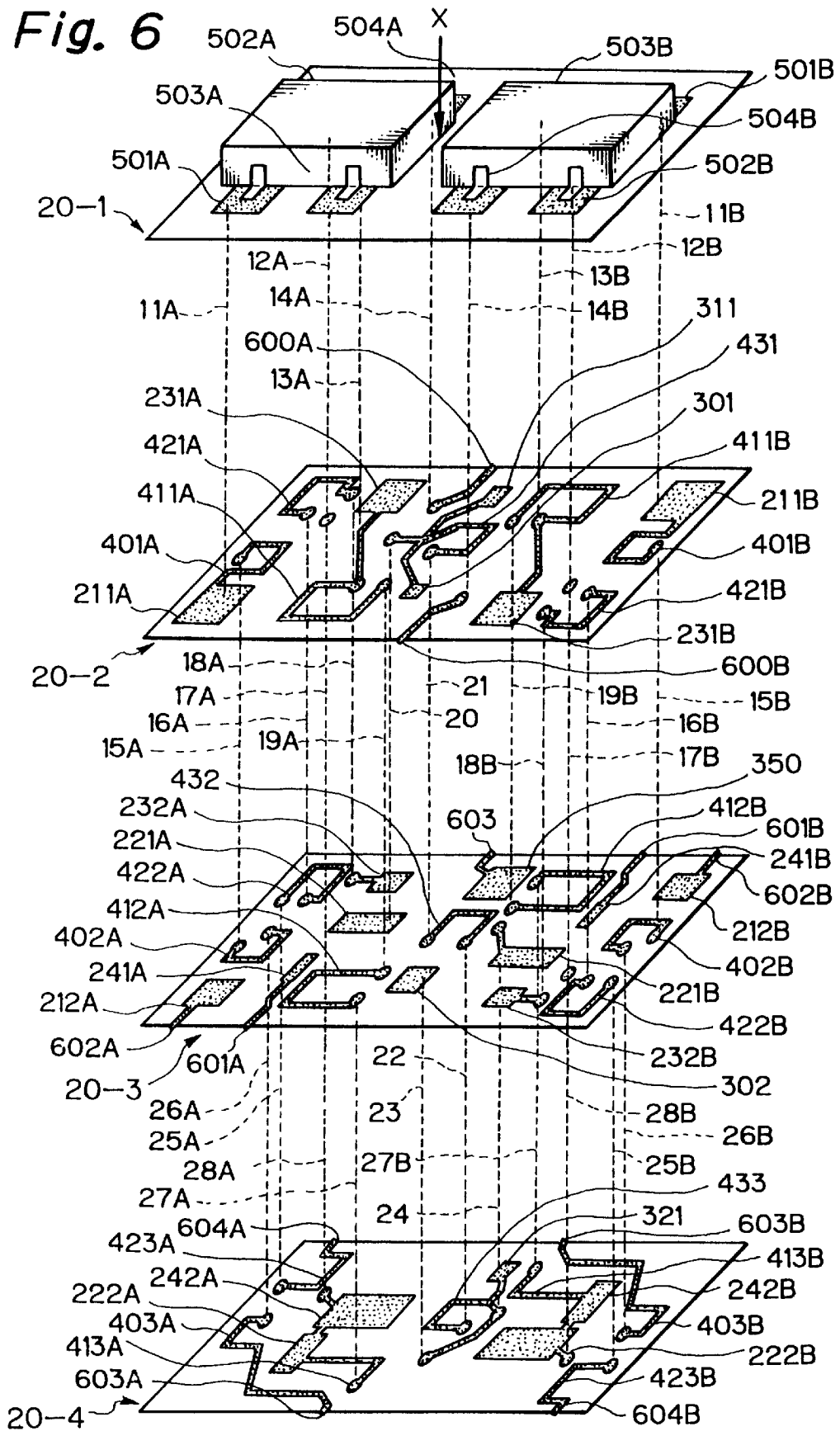
FIG. 6 shows upper half of perspective disassembled view of an antenna switch according to the present invention.
Figure 7:
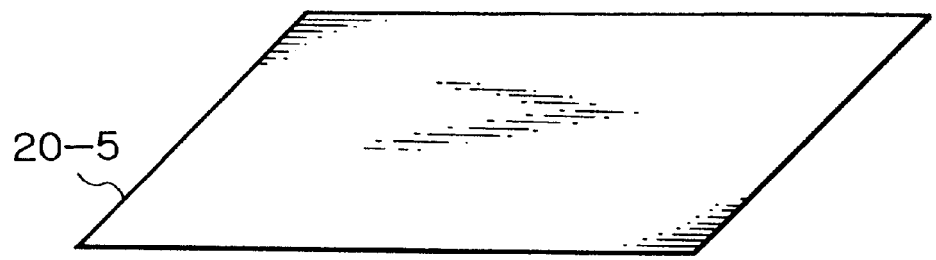
FIG. 7 shows lower half of perspective disassembled view of an antenna switch according to the present invention.
Figure 7:
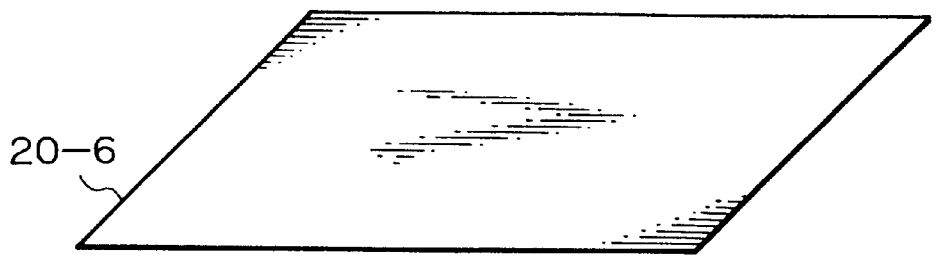
Figure 7:
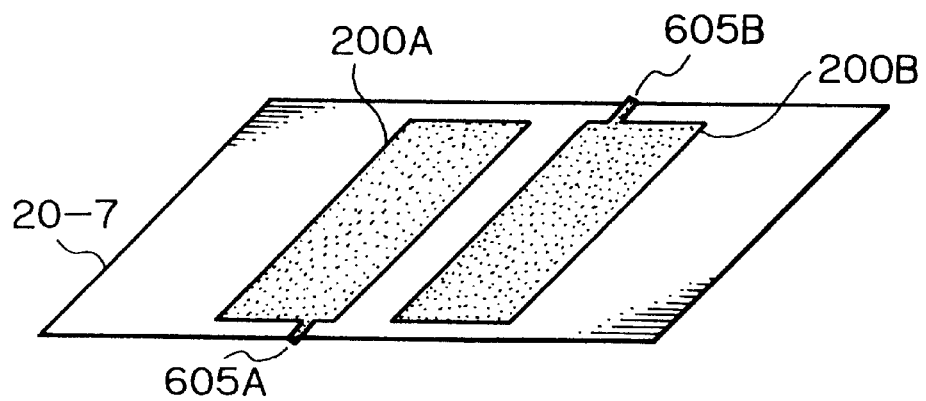
Figure 7:
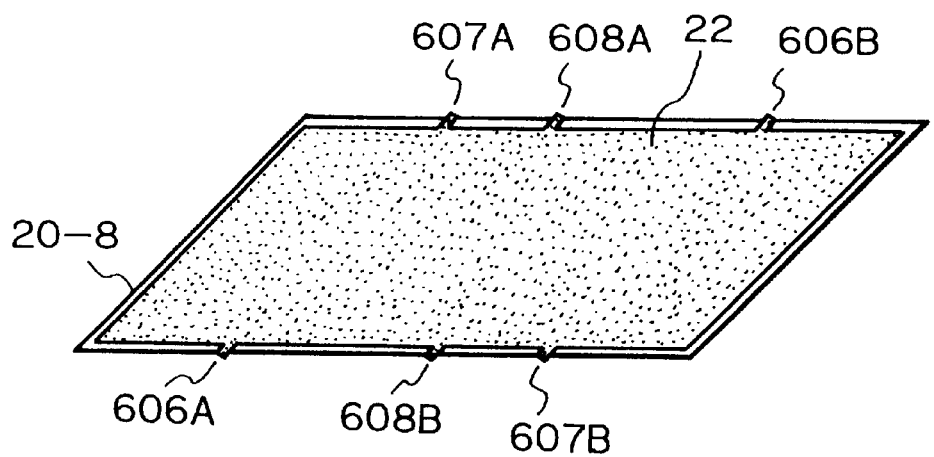
Figure 8:
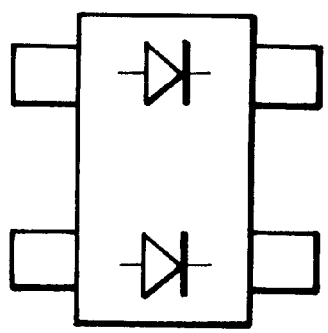
FIG. 8 is a package of a diode.
Figure 9:
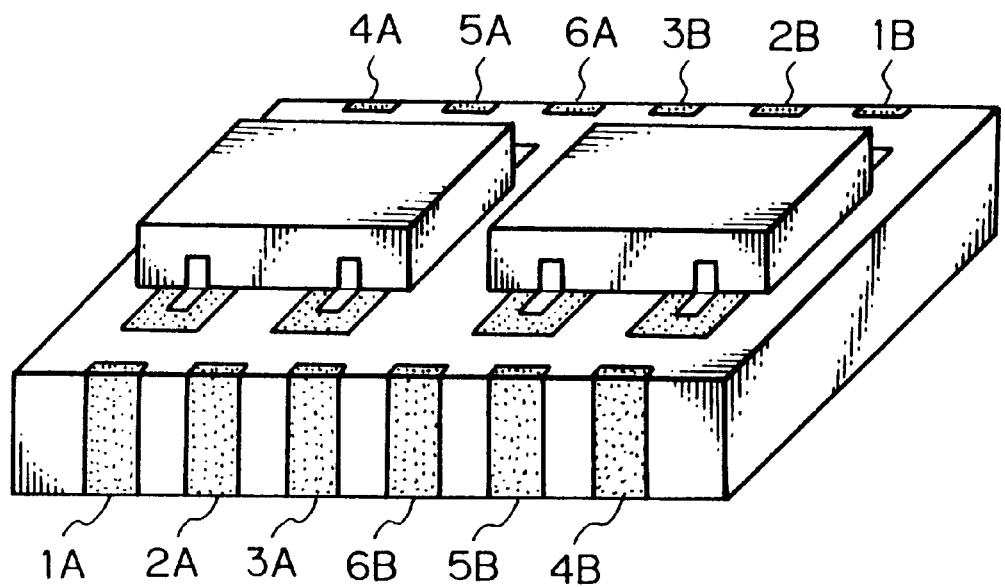
FIG. 9 is a perspective view of a completed antenna switch according to the present invention.

FIG. 6 shows an upper half layers of an antenna switch, FIG. 7 shows a lower half layers of the antenna switch, FIG. 8 shows a diode package, and FIG. 9 shows an external view of the antenna switch.

In FIG. 9, the symbol 1A is a Tx (transmission) terminal, 2A, 2B, 5A, 5B, 6A and 6B are a ground terminal, 3A is a Vb1 (bias current for transmit/receive switching) terminal, 3B2 is a Vb2 (bias current for switching antennas) terminal, 1B is an ANT2 terminal (terminal to be coupled with a second antenna), 4B is an ANT1 terminal (terminal to be coupled with a first antenna), and 4A is a Rx terminal (output of received signal). A PIN diode used in the embodiment of FIG. 9 is a surface mount component as shown in the package in FIG. 8.

In FIG. 6, an electrode 501A for mounting a component is coupled with an anode of a PIN diode D1A, an electrode 502A is coupled with a cathode of the PIN diode D1A, an electrode 503A is coupled with an anode of a PIN diode D2A, an electrode 504A is coupled with a cathode of the PIN diode D2A. An electrode 501B is coupled with an anode of a PIN diode D1B, an electrode 502B is coupled with a cathode of the PIN diode D1B, an electrode 503B is coupled with an anode of a PIN diode D2B, and an electrode 504B is coupled with a cathode of the PIN diode D2B.

In the perspective view of FIG. 6, the arrow X shows the center of each layers of the multi-layer substrate 20. An electrode with the symbol A is located with point symmetrical relation concerning the center X of a layer with an electrode with the symbol B of the same reference numeral. For instance, an electrode 211A is point symmetrical with an electrode 211B concerning the center X of a layer of the substrate, electrodes 401A and 401B are point symmetrical concerning the center X of a layer of the substrate. As a conductive pattern with the symbol B (antenna switch portion) is the same as that with the symbol A (transmit/receive switch portion), a pattern with the symbol A is described, but a pattern with the symbol B is omitted.

In FIGS. 6 and 7, the numerals 20-1 through 20-8 show a first layer through an eighth layer (dielectric layer) of a multi-layer substrate 20.

An electrode 211A on the second layer 20-2 and an electrode 212A on the third layer 20-3 sandwich the second layer 20-2 (dielectric layer) to provide a capacitor C21A. Said electrode 211A is coupled through a through-hole electrode 11A with an electrode 501A which is connected to an anode of a PIN diode D1A.

The electrode 212A on the third layer 20-3 is coupled through an electrode 602A with a side terminal 1A which is a transmission terminal Tx.

A substantially C-shaped or U-shaped electrode 401A which is coupled with the electrode 211A on the second layer 20-2 is coupled through a through-hole electrode 15A with a C-shaped or U-shaped electrode 402A on the third layer 20-3, and further, coupled through a through-hole electrode 26A with an electrode 403A on a fourth layer 20-4 so that a coil L20A is provided. One end of the coil L20A is coupled through an electrode 603A on the fourth layer 20-4 with a side terminal 3A, which is a bias terminal Vb1 for transmit/receive switching.

A capacitor C22A which is coupled with a cathode of a PIN diode D1A is provided with an electrode 221A on the third layer 20-3 and an electrode 222A on the fourth electrode 20-4 sandwiching the third layer 20-3. The electrode 502A which is connected to the cathode of the PIN diode D1A is coupled through through-hole electrodes 12A, 17A and 28A with the electrode 222A of the capacitor C22A on the fourth layer 20-4.

Said electrode 222A is coupled with an electrode 242A and an electrode 413A on the fourth layer 20-4. The electrode 242A is one of the electrodes of a capacitor C24A which has another electrode 241A on the third layer 20-3 through the third layer 20-3. The electrode 241A is coupled through an electrode 601a on the third layer 20-3 with a side terminal 2A (ground terminal).

The electrode 413A on the fourth layer 20-4 is coupled through a through-hole electrode 27A with an electrode 412A on the third layer 20-3, and the latter is coupled through a through-hole electrode 19A with an electrode 411A on the second layer 20-2 so that a coil L21A is provided.

The electrode 411A of the c oil L21A is coupled through a through-hole electrode 12A with an outer electrode 503A which is coupled with an anode of a PIN diode D2A. Said electrode 411A is also coupled with an electrode 231A on the second layer 20-2.

The electrode 231A and an electrode 232A on the third layer 20-3 sandwich the second layer 20-2 to provide a capacitor C23A.

The electrode 232A of the capacitor C23A is coupled through a through-hole electrode 18A with an electrode 421A on the second layer 20-2. The electrode 421A is coupled through a through-hole electrode 16A with an electrode 422A on the third layer 20-3, and the latter (422A) is coupled through a through-hole electrode 25A with an electrode 423A on the fourth layer 20-4 so that a coil L22A is provided.

The electrode 423A of the coil L22A is coupled with a lead electrode 604A on the fourth layer 20-4, and is coupled with a side terminal 4A which is a receive terminal Rx.

An electrode 504A which is coupled with a cathode of a PIN diode D2A is coupled through a through-hole electrode 14A with a lead electrode 600A on the second layer 20-2, and is coupled with a side terminal 5A to be grounded.

A ground capacitor C20A is provided by a ground electrode 22 which extends on the whole surface of an eighth layer 20-8 and an electrode 200A on seventh layer 20-7 facing with said ground electrode 22 through the seventh layer 20-7. Said electrode 200A is coupled through an electrode 605A on the seventh layer 20-7 with a side terminal 3A which is a bias terminal Vb1 for transmit/receive switch. The side terminal 3A is also coupled on the fourth layer 20-4 with the electrode 603A of the coil L20A.

The ground electrode 22 on the eighth layer 20-8 is coupled through lead electrodes 606A, 607A, 608A (and 606B, 607B, 608B) with side terminals 2A, 5A, 6A (and 2B, 5B, 6B) each of which is a ground terminal.

Thus, a conductive pattern symboled with A (transmit/receive switch portion) has been described.

Next, a low-pass filter is described. This portion is produced around the center X of the multi-layer substrate 20, although it is not necessary to pattern circuit elements of the low-pass filter with point symmetric relation around the center X of the multi-layer substrate 20. The low-pass filter portion has input/output ports which are the electrode 221A which is one of the electrodes of the capacitor C22A in the transmit/receive switch portion on the third layer 20-3, and the electrode 221B which is one of the electrodes of the capacitor C22B in the antenna switch portion on the third layer 20-3. Said electrode 221A on the third layer 20-3 is coupled through a through-hole electrode 20 with the electrodes 431, 301 and 311 on the second layer 20-2.

Said electrode 431 is coupled through a through-hole electrode 21 with an electrode 432 on the third layer 200-3, and the latter is coupled through a through-hole electrode 22 with an electrode 433 on the fourth layer 20-4, so that a coil L30 is provided. Further, said electrode 311 on the second layer 20-2 faces through the second layer 20-2 with an electrode 350 on the third layer 20-3 to provide a capacitor C31A. The electrode 350 on the third layer 20-3 is coupled with a side terminal 5A (ground terminal) through a lead electrode 603.

Said electrode 301 on the second layer 20-2 faces through the third layer 20-3 with the electrode 302 on the third layer 20-3 so that a capacitor C30 is provided. Said electrode 302 on the third layer 20-3 is coupled through a through-hole electrode 23 with an electrode 433 which is a part of said coil L30 on the fourth layer 20-4. Thus, the capacitor C30 and the coil L30 are coupled parallel with each other.

Said electrode 433 on the fourth layer 20-4 is coupled with the electrode 321 on the fourth layer 20-4, and the latter electrode 321 faces through the third layer 20-3 with the electrode 350 so that a capacitor C31B is provided.

Said electrode 433 is coupled through a through-hole electrode 24 with the electrode 221B on the third layer 20-3. Said electrode 221B is one of the electrodes of the capacitor C22B, and is one of the input/output ports of the low-pass filter portion. Thus, the low-pass filter portion is obtained.

In the above embodiment, the surface capacitors, and the coils are obtained by the second layer, the third layer and the fourth layer, the spacer portion is obtained by the fourth layer, the fifth layer, and the sixth layer. And, the seventh layer and the eighth layer provide the grounded capacitors.

When a conductive pattern for a coil is produced, said conductive pattern for a coil should be patterned so that it does not overlap with external electrodes (501A, 502A, 503A, 504A, 501B, 502B, 503B and 504B) on the surface of the substrate so that the value Q of the coils is not decreased.

If a coil in the substrate is located close to another coil, those coils would magnetically and/or electrically couple with each other. Therefore, coils which are produced through patterning process must be located with enough spacing with each other. In the present invention which locates an antenna switch portion and a transit/receive switch portion with point symmetrical relations around the center X of the multi-layer substrate, corresponding coils (for instance coils L21A and L21B) in a transmit/receive switch portion and an antenna switch portion are patterned with enough spacing with no idle area on the layers. The coupling of said coils L21A and L21B would cause to bypass the low-pass filter, and would deteriorate attenuation characteristics for harmonic frequencies of signal which the present antenna switch handles.

Further, a capacitor provided between two coils is advantageous to prevent the coupling of said coils. In the present embodiment, the capacitor C24A is mounted between the coils L20A and L21A, and the capacitor C24B is mounted between the coils L20B and L21B. This structure is advantageous to mount many elements in narrow patterning area.

As for a spacer portion, as it is thicker, it is better for characteristics for capacitors which are not grounded and coils. However, when it is too thick, and it is made of ceramics, the problem would occur in removing binder in sintering process, and/or separating a chip from a mother substrate which has many substrates into a plurality of individual substrates as shown in FIG. 9. Therefore, one practical example is that the thickness of a spacer portion is designed so that the total thickness of the substrate is less than 1.5 mm (when it is made of ceramics, it is the thickness after sintered).

(Another embodiment)

The following modifications are also possible in the present invention.

(1) A switch portion described above is only one embodiment, and another structure of a switch portion is possible for a multi-layer substrate of the present invention.

(2) Also, another structure of a low-pass filter portion, for instance, a multi-stage low-pass filter is possible. In that case, impedance at input port and output port of the low-pass filter should be the same as each other.

Figure 11:
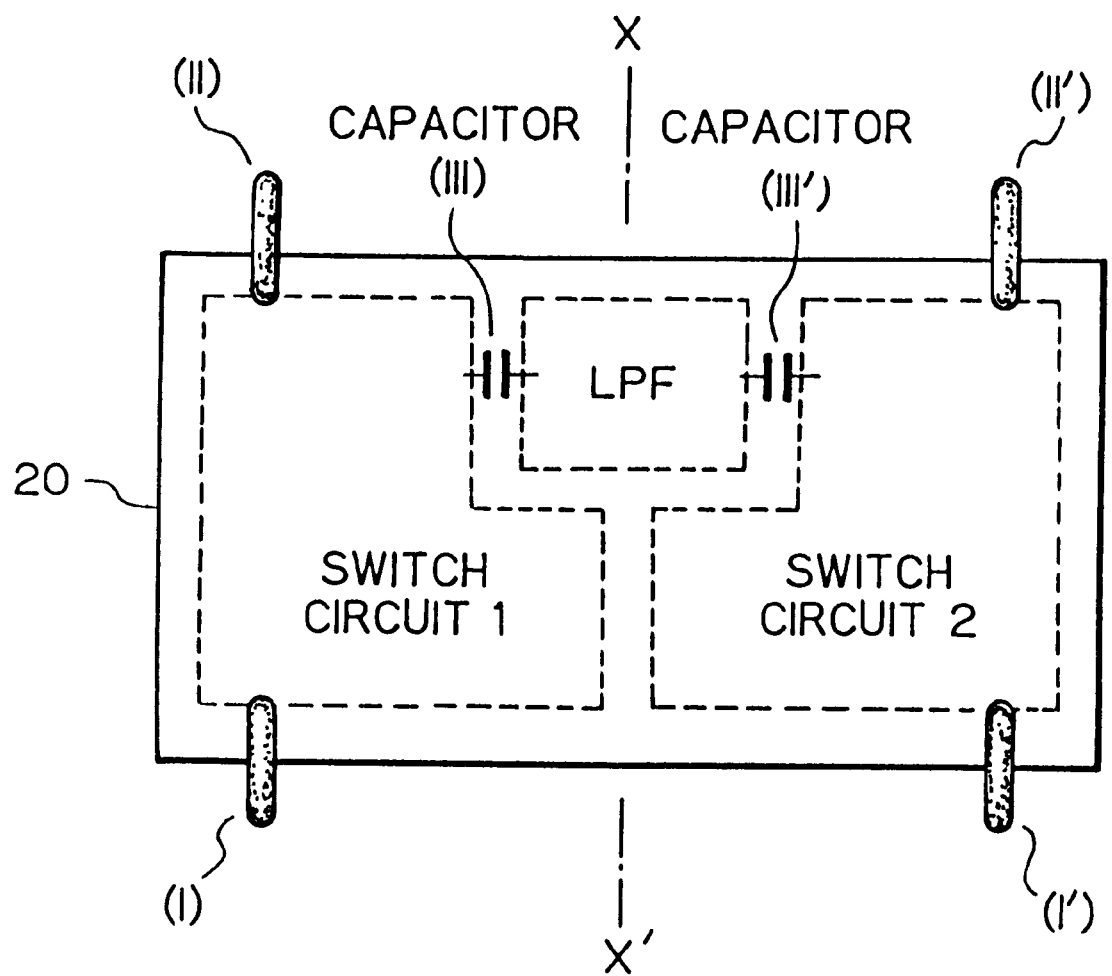
FIG. 11 shows a pattern arrangement of the other embodiment of an antenna switch according to the present invention.

(3) In the above embodiment, circuit elements on the layers are located in point symmetrical relations. Axial symmetrical relation is also possible instead of point symmetrical relation. When it is axial symmetry, FIG. 11 is used instead of FIG. 2, and FIG. 6 is replaced by FIG. 12. In FIG. 12, coils 402A and 402B are located with axial symmetrical relation around an axis XX' which is in the plane of a layer.

(Effect of the invention)

The present invention has the following effects.

(1) Because of symmetrical location of circuit elements on the layers, number of kind of numerical values of circuit elements is almost half as compared with number of kind of numerical values of circuit elements in a prior art. Therefore, the combination of circuit elements is decreased when object characteristics are implemented through experiment. Thus, quick development or design of a circuit is possible.

(2) Patterning process for providing circuit elements may use the symmetrical relation of the elements, and the producing steps may be almost half as compared with a prior art. Therefore, the problems in patterning process are easily found, and the solutions for the problems are easily found.

(3) As for input impedance at each port, a pair of ports have the same impedance as each other because of symmetrical relations, although a prior circuit has different impedance for each ports. Therefore, the evaluation of characteristics is easy. In other words, it is enough to measure impedance of two ports out of four ports.

(4) An antenna switch is small in size because no strip line is used.

(5) The thickness of a substrate may be small, when an inductor (coil) and a capacitor are produced by using a multi-layer substrate of ceramics. Also, binder in sintering process is removed, and individual circuits are obtained by separating a chip from a mother board which has many circuits into a plurality of individual circuits. In a prior art, the thickness of a substrate must be larger than a predetermined value because of characteristic impedance.

(6) Coupling between coils produced in a multi-layer substrate is prevented, and therefore, the characteristics close to the designed ones are obtained. In particular, at harmonic frequencies of a signal to be handled, excellent result is expected.

(7) Low insertion loss, and large isolation are obtained in the above circumstances.

(8) As the circuit is in point symmetrical relation around center X of a multi-layer substrate, terminals for external connection are also located with point symmetrical relation. Therefore, the present antenna switch is not directional, and is used by rotating by 180°. Therefore, in producing steps of the present antenna switch (mounting a PIN diode, testing characteristics, printing or stamping, and/or packaging et al), and mounting the antenna switch on a mother printed circuit board, no trouble occurs relating to direction of a component. Because, according to the present invention, a component may be mounted even by rotating 180°.

What is claimed is:

1. An antenna switch comprising:

a first switch means including a plurality of circuit components, said first switch means for coupling a predetermined point with one of two terminals and for separating electrically the other terminal according to a control signal, a second switch means including a same plurality of circuit components as said first switch means, a filter coupled with said first switch means through a first capacitor means, and coupled with said second switch means through a second capacitor means, first and second antennas coupled to said second switch means, each circuit component composing said first switch means being in a symmetrical relationship, with respect to said filter, with each corresponding circuit component composing said second switch means, wherein a numerical value of each of said circuit components in said first switch means is the same as a numerical value of the corresponding circuit components in said second switch means, wherein each of said first switch means and said second switch means has a resonator, having an inductor and a capacitor, which electrically separates circuit components which are switched off.

2. An antenna switch according to claim 1, wherein said first switch means switches between a transmission terminal and a reception terminal, and said second switch means switches between said first antenna and said second antenna.

3. An antenna switch according to claim 1, wherein at least part of circuit components, composing a) each of said switch means, b) said filter and c) each of said capacitors means, are mounted on a multi-layer substrate which has a terminal for external connection of the antenna switch with an external circuit, and each of said circuit components composing said first switch means are located on each of the layers of said multi-layer substrate in a symmetrical relationship, with respect to a center of each layer, to corresponding circuit components composing said second switch means.

4. An antenna switch according to claim 1, wherein said symmetrical relationship is a rotational symmetrical relationship.

5. An antenna switch according to claim 1, wherein said symmetrical relationship is an axial symmetrical relationship.

6. An antenna switch according to claim 3, wherein a component in said first switch means and the corresponding component in said second switch means are mounted on the same layer.

7. An antenna switch according to claim 3, wherein said multi-layer substrate comprises a grounded capacitor having a ground electrode on substantially the whole surface of a bottom dielectric layer facing with another electrode through said layer, a spacer portion provided on said grounded capacitor, and another portion provided on said spacer portion including a coil and capacitors except said grounded capacitor.

8. An antenna switch according to any of claims 1–5 wherein each of said first switch means and said second switch means is a switch which switches a signal by turning ON and OFF current in a PIN diode.

9. An antenna switch according to claim 3, wherein said terminal for external connection is mounted on side wall of said multi-layer substrate.

10. An antenna switch according to claim 1, wherein the circuit components of each of said first and second switch means comprises;

a series circuit of a first capacitor and a first diode between the first terminal and said predetermined point, the resonator formed as a series circuit of a first inductor and a second capacitor inserted between a junction point of said first capacitor and said first diode, and ground, a control terminal coupled with a junction point of said first inductor and said second capacitor, a third capacitor between said predetermined point and ground, a series circuit of a second inductor, a fourth capacitor and a third inductor inserted between said predetermined point and the second terminal, and a second diode between a junction point of said second inductor and said fourth capacitor, and ground.

* * * * *